(12) United States Patent
Clunn

(10) Patent No.: US 7,629,795 B2
(45) Date of Patent: Dec. 8, 2009

(54) VECTOR IMPEDANCE MEASUREMENT SYSTEM AND METHOD OF USING SAME

(75) Inventor: Robert H. Clunn, Richardson, TX (US)

(73) Assignee: John D. Terleski, Sunnyvale, TX (US)

( * ) Notice: Subject to any disclaimer, the term of this patent is extended or adjusted under 35 U.S.C. 154(b) by 183 days.

(21) Appl. No.: 11/830,179

(22) Filed: Jul. 30, 2007

(65) Prior Publication Data

US 2009/0033339 A1 Feb. 5, 2009

(51) Int. Cl.
  G01R 31/08 (2006.01)
  G01R 31/02 (2006.01)
  G01R 27/28 (2006.01)
(52) U.S. Cl. .................. 324/525; 324/537; 324/650
(58) Field of Classification Search ............ 324/650, 324/525, 537
  See application file for complete search history.

(56) References Cited

U.S. PATENT DOCUMENTS

| | | | | |
|---|---|---|---|---|
| 4,409,544 | A * | 10/1983 | Redlich | 324/650 |
| 6,326,929 | B1 * | 12/2001 | Berranger | 343/703 |
| 6,876,935 | B2 * | 4/2005 | Kamitani | 702/65 |
| 7,030,627 | B1 * | 4/2006 | Ashley | 324/650 |
| 2008/0234574 | A1 * | 9/2008 | Hancock et al. | 600/430 |

OTHER PUBLICATIONS

Hallas, Joel R., Three Antenna System Measurement Devices, QST, Aug. 2007.
Keith, Larry, TinyCAD, QST, Aug. 2007.

* cited by examiner

Primary Examiner—Amy He
(74) Attorney, Agent, or Firm—Price, Heneveld, Cooper, DeWitt & Litton

(57) ABSTRACT

A vector impedance measurement system (100) includes a first radio frequency (RF) source (101) for providing energy to a test circuit. A measurement device (111) is used for providing a first network measurement based upon the voltage and current at the terminals of the test circuit. A second RF source (103) is used for down converting the first network measurement to a second network measurement that is lower in frequency. The vector impedance system (100) operates to calculate a complex impedance using both the magnitude and phase angle of the second network measurement as determined by a processor (133). In that the lower frequency at which signal processing is performed is a fixed frequency, many sensitive parameters of the band pass filters, such as gain and phase shift, can be easily calibrated and do not change during operation, resulting in a simpler calibration process and very accurate data measurements.

23 Claims, 2 Drawing Sheets

VECTOR IMPEDANCE MEASUREMENT SYSTEM AND METHOD OF USING SAME

FIELD OF THE INVENTION

The present invention relates to antenna impedance measurements and more particularly to a vector impedance measurement system.

BACKGROUND

Vector impedance analyzers have been used for many years and are often used to provide very accurate and thorough antenna, component, and material evaluation. The impedance analyzer measures impedance (inductance, capacitance, and resistance) at one or more radio frequency (RF) ranges. The tool offers this data when using an AC signal level swept measurement function for evaluating an antenna or other device under actual operating conditions.

The one disadvantage of conventional, laboratory grade vector impedance analyzers is they are very expensive for those except corporations, institutional entities and government. In order to reduce cost, many analyzers do not measure a complex impedance (magnitude and phase) with sufficient accuracy, do not cover a wide impedance range with true phase angle nor do they distinguish between positive and negative reactance. Although some analyzers can calculate various parameters, the data is not displayed in a form that is easy for the operator to visualize.

Still other problems occur when an analyzer is used with an antenna system. When using the analyzer for this function, its performance can be significantly affected by extraneous radio signals received at the antenna that is being analyzed. While some lower cost devices may be suitable for some purposes, they are not appropriate for accurate measurements in the presence of strong, externally generated RF signals that inadvertently are input to the device. This might occur, for example, when the antenna is receiving strong broadcast stations operating at one frequency, while attempting to take accurate measurements for the antenna at a second frequency.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
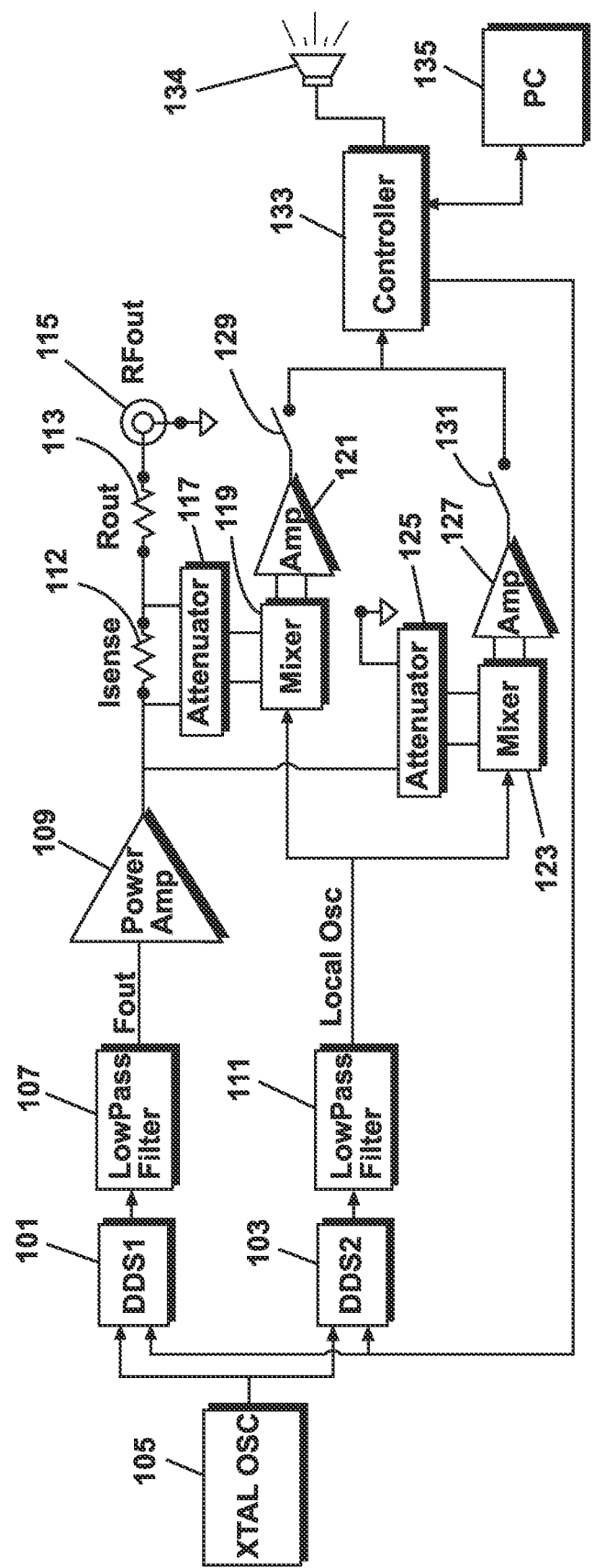
FIG. 1 is a block diagram illustrating a vector impedance analyzer in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to a vector impedance measurement system. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of a vector impedance measurement system described herein. The non-processor circuits may include, but are not limited to, a radio receiver, a radio transmitter, signal drivers, clock circuits, power source circuits, and user input devices. As such, these functions may be interpreted as steps of a method to perform vector impedance measurement. Alternatively, some or all functions could be implemented by a state machine that has no stored program instructions, or in one or more application specific integrated circuits (ASICs), in which each function, or some combinations of certain of the functions, are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

FIG. 1 illustrates a block diagram of a vector impedance measuring system 100 in accordance with an embodiment of the invention. The vector impedance measuring system 100 includes a first direct digital synthesis (DDS) source that acts as a master oscillator for providing an RF output signal that is related to a final programmed frequency. A DDS is a method of producing an analog waveform—usually a sine wave—by generating a time-varying signal in digital form and then performing a digital-to-analog conversion. Because operations within a DDS device are primarily digital, the DDS can offer fast switching between output frequencies, fine frequency resolution, and operation over a broad spectrum of frequencies.

With advances in design and process technology, the DDS device as used herein is very compact and uses little power. DDS devices typically can be programmed through a high speed serial peripheral-interface (SPI) port and need only an external clock to generate simple sine waves. DDS devices are operable to generate frequencies from less than 1 Hz up to 400 MHz (based on a 1-GHz clock). The benefits of their low power, low cost, and single small package, combined with their inherent excellent performance and the ability to digitally program (and reprogram) the output waveform, make DDS devices an attractive solution that are preferable to less-flexible solutions comprising aggregations of discrete components. It will be recognized that this type of measurement system can be achieved using alternative signal sources, for example, phase locked loops or frequency locked loops.

The DDS 101 is used for stimulating the circuit under test and typically operates in a range from 1 Hz to 180 MHz. A second DDS source 103 is used to generate a local oscillator (LO) signal for a plurality of mixers 119, 123 as described herein. Both the first DDS 101 and second DDS 103 typically use a frequency standard or reference such as quartz crystal oscillator 105. In an alternative embodiment, it is also possible to use a portion of the DDS 101 or DDS 103 as an oscillator that is equivalent in function to DDS 101. In some implementations, DDS 101 may also operate much higher in frequency in order to program the DDS 101 or DDS 103 to higher frequencies to extend the frequency range of operation of this vector impedance measuring system 100. Thus, DDS chip 101 is used to generate the primary frequency for stimulating the circuit under test while DDS 103 is programmed to a slightly different frequency from the frequency DDS 101 so it can be used as an LO to convert the high frequency of the DDS 101 master oscillator to a lower frequency by using principles of "mixing" or "heterodyning." As discussed hereinafter, this type of band pass filtering works to reject extraneous signals that might otherwise interfere with the measurement. Moreover, this conversion to a lower frequency simplifies the data acquisition process for improving the overall accuracy of the data.

At the outputs of DDS 101 and DDS 103 are low pass filters 107 and 111 respectively. Each low pass filter 107, 111 is typically comprised of several capacitors and inductors for the purpose of filtering out harmonics generated by the digital synthesis process. At the output of the low pass filter 107, the filtered signal $F_{out}$ provides the drive signal or stimulus for a circuit under test (not shown). Although this signal may not require amplification, an RF amplifier 109 may be used to increase the amplitude of the $F_{out}$ signal. The output of the low pass filter 107 may be amplified to increase the signal delivered to the circuit under test. This technique makes the analyzer more tolerant to interference from strong external RF signals than other vector impedance measurement equipment currently used in the prior art. The voltage and current signals are heterodyned to a lower frequency by mixing the outputs of the direct digital synthesizers. The signals that are presented to the inputs of the mixers are attenuated to avoid overloading the mixers. The signal output from the RF power amp 109 is directed to a resistor 112 and resistor 113 that are series connected. The signal from resistor 113 is delivered to an RF output 115 where the circuit under test is connected.

In operation, the current flowing through resistor 111 develops a voltage across resistor 111 that is proportional to the current flowing into the circuit under test. A mixer 119 includes a plurality of differential inputs that receive this differential voltage though an attenuator 117. The mixer 119 converts this voltage to a sine wave signal having a frequency equal to the difference between the programmed frequencies of the DDS 101 and DDS 103. In turn, the differential outputs from mixer 119 drive the differential inputs of an operational amplifier 121 which is connected so that its output is proportional to the difference between its two inputs. Thus the operational amplifier 121 converts two differential signals to a single output while also providing band pass filtering to reduce the effect of extraneous signals that are more than a few kilohertz away from the measurement frequency. Although a resistors are used in this embodiment for facilitating both voltage and current measurements, those skilled in the art will recognize that a transformer or similar components may also be used for the same purpose.

Further, a voltage reference channel is comprised of mixer 123 that receives a return signal that is attenuated by attenuator 125 for producing a differential output proportional to the voltage of the $F_{out}$ signal. As noted above, the $F_{out}$ signal is proportional to the voltage applied to the circuit under test. The differential outputs of the mixer 123 are processed by operational amplifier 127 that is equivalent in operation to the other operational amplifier circuit 121. The output of the operational amplifier 121 is a signal proportional to the current flowing into the circuit under test and the output of operational amplifier 127 is a signal proportional to the voltage applied to the circuit under test. Therefore, these two outputs that are sine waves typically in the audio frequency range, can be easily processed to determine the impedance of the circuit under test by taking a ratio of the voltage from operational amplifier 127 divided by the voltage from operational amplifier 121. By taking into account both the magnitude and phase of these two signals, the true complex impedance can be determined. This complex impedance value indicates the true sign (positive or negative) of the reactive component without ambiguity.

In another embodiment, the outputs of the operational amplifier 121 and operational amplifier 127 may be connected to a track-and-hold circuit (not shown) with a storage capacitor or the like. An analog multiplexer, for example switches 129 and 131, determines which of the two signals is connected to the track-and-hold circuit so these signals can be digitized at the proper time by an analog to digital converter (ADC). It should be evident to those skilled in the art that an ADC could be located either internal or external to the microcontroller circuit 133. An additional operational amplifier (not shown) can be used to buffer the analog signal and a resistor can be used to adjust the overall gain of the circuit. Another section of an operational amplifier may be used as a comparator to generate a digital synchronizing signal for the microcontroller 133. This synchronizing signal allows the ADC to always begin digitizing the analog sine wave signals from the operational amplifiers 121,127 at the proper times.

The microcontroller 133 works to accept commands from the main control computer such as PC 135 sending data to the PC 135 through a data channel to be displayed on a suitable display device (not shown) in numeric and/or graphic format. In one implementation, the data input/output channel is a RS232 channel; however, it is also possible to communicate with the PC 135 with a universal serial bus (USB) data channel or a parallel data channel. The PC 135 can be any one of a variety of computers from a variety of manufacturers. Its function is to send commands to and receive data from the vector impedance measurement system 100. The PC 135 displays the data on a suitable data display or monitor and it may or may not operate to process the data mathematically using various algorithms. It will be further recognized that the functions of the microcontroller 133 may also be implemented using the PC 135. In this implementation, the PC 135 works to perform one or more control and/or digitizing functions that are external to the operational components of the vector impedance measuring system 100. Although this implementation may reduce component count, it can cause many operational difficulties in view of its heavy reliance on the operating system of the PC 135. However, by partitioning the work load between an embedded microcontroller 133 and the PC 135, the preset invention reduces the dependency on the PC operating system with little increase in overall expense.

Moreover, the microcontroller 133 can also generate an audio output for signaling information to the operator. This audio signal is delivered to an audio amplifier (not shown) that drives a speaker 134 or other sounding device. The frequency of the audio signal can be programmed over a predetermined audio range. The amplitude of this audio signal can also be programmed by the microcontroller 133 using pulse width modulation (PWM). The PWM signal would typically be filtered by a capacitor to control the amplitude of the signal that drives the speaker 134 or equivalent sounding device. The audio output from the micro-controller can also be programmed to synthesize speech that can represent data or commands in a human-understandable format. The audio output can also be used to sound out data in a code, such as Morse code. The value of the sound output is to enable the operator to receive data related to the measurements on the circuit under test while making adjustments without having to visually look at a data readout or display. It also allows the vector impedance measurement system 100 to be used by an operator with a visual impairment.

Figure 2:
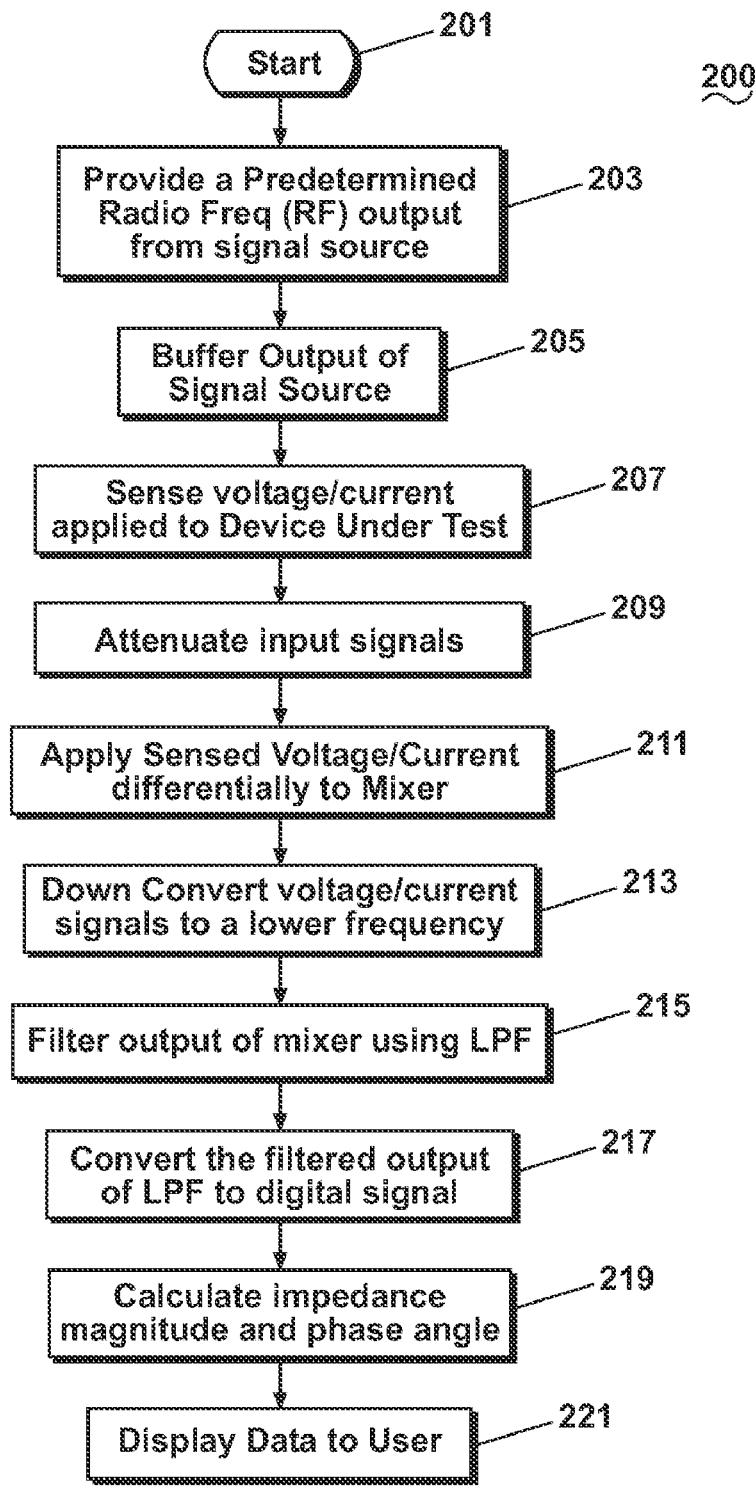
FIG. 2 is a flow chart diagram illustrating the process used by the vector impedance analyzer in accordance with an embodiment of the invention.

FIG. 2 is a flow chart diagram illustrating the process 200 used by the vector impedance analyzer in accordance with an embodiment of the invention. The process starts 201 where an RF output signal from a source is provided 203 at some predetermined frequency. This output is buffered 205 and the voltage and current of the device under test is sensed 207. These sensed signals are then attenuated 209 and applied differentially 211 to separate mixer circuits. At the mixer, these signals are down converted 213 to a lower frequency where they are filtered 215 and then converted 217 to digital signals. These digital signal are used to calculate 219 the magnitude and phase angle of the impedance of the test device. Thereafter, this data is displayed 221 to the user. A test device includes such passive linear elements as resistors, capacitors, inductors, filters and/or antennas.

Thus, the present invention is directed to a new vector impedance measurement system and method that is more accurate than existing equipment in other relatively lower cost systems and methods. In accordance with an embodiment of the invention, the vector impedance measurement system utilizes a master oscillator, which drives two or more DDS to provide an RF test signal to the antenna or network being analyzed and also to measure both the voltage and the current flowing into and/or from the antenna or network being analyzed. The output of a DDS is amplified to increase the signal delivered to the circuit under test. This technique makes the analyzer more tolerant to interference from strong external RF signals than other vector impedance measurement equipment. Measurements are taken of both voltage and current and used to calculate the magnitude and phase angle of the device's impedance at a given frequency where it can be graphically, numerically or aurally displayed to the user.

Further, the voltage and current signals are heterodyned to a lower frequency by mixing the outputs of the direct digital synthesizers. The signals that are presented to the inputs of the mixers are attenuated to avoid overloading the mixers. At a lower frequency the signals can be more easily amplified and filtered with band pass filters and then converted in a series of digital samples using a conventional analog to digital converter (ADC). The lower frequency at which signal processing is performed is a fixed frequency, typically in the audio range, so many sensitive parameters of the band pass filters, such as gain and phase shift, can be easily calibrated and they do not change during operation. This results in a simpler calibration process and much more accurate data. By accurately measuring the voltage applied to the circuit under test, the current flowing into the circuit under test, and their phase relationship, the impedance present at a port of the vector impedance measurement system can be accurately calculated. From this raw data, many other parameters of the circuit can also be calculated and displayed to aid in determination of the circuit properties.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

I claim:

1. A vector impedance analyzer for measuring the impedance characteristics of a test device comprising:
    a first oscillator internal to the vector impedance analyzer for providing a radio frequency (RF) signal to a test device;
    a voltage measuring network for measuring the voltage applied to the test device;
    a current measuring network for measuring the current flowing to the test device;
    a second oscillator for providing a local oscillator signal;
    a first mixer for down converting a voltage measurement to a lower frequency;
    a second mixer for down converting a current measurement to a lower frequency;
    at least one digital microcontroller for calculating a complex impedance from a magnitude and phase angle of a high voltage measurement or high current measurement received from the test device; and
    wherein the first mixer and second mixer operate linearly in the presence of the substantially high voltage measurement or high current measurement.

2. A vector impedance analyzer as in claim 1, wherein the at least one microcontroller receives signals from the first mixer and second mixer.

3. A vector impedance analyzer as in claim 1, further comprising:
    a personal computer operating separately from the vector impedance analyzer for receiving a signal from the first mixer and second mixer.

4. A vector impedance analyzer as in claim 1, wherein the first oscillator and second oscillator use direct digital synthesis (DDS).

5. A vector impedance analyzer as in claim 1, wherein the first oscillator and second oscillator are phase locked loop (PLL) synthesizers.

6. A vector impedance analyzer as in claim 1, wherein the voltage measuring network includes at least one resistor.

7. A vector impedance analyzer as in claim 1, wherein the voltage measuring network includes at least one transformer.

8. A vector impedance analyzer as in claim 1, further comprising:

an attenuator for providing an input signal to the first mixer at a predetermined level.

9. A vector impedance analyzer as in claim 1, further comprising:
an attenuator for providing an input to the second mixer at a predetermined level.

10. A vector impedance analyzer as in claim 1, further comprising:
at least one operational amplifier for providing a serial output from the first mixer and second mixer to the at least one microcontroller.

11. A vector impedance analyzer as in claim 1, further comprising:
a power amplifier for amplifying the output of the first oscillator to a predetermined power level.

12. A vector impedance analyzer as in claim 1, wherein the microcontroller calculates both magnitude and phase of the signals from the first mixer and second mixer.

13. A vector impedance analyzer as in claim 1, wherein a computer connects with the at least one microcontroller for displaying vector impedance measurement data.

14. A vector impedance analyzer as in claim 1, wherein the test device is an antenna.

15. A vector impedance analyzer as in claim 1, wherein the test device is a passive linear elements from the group of resistor, capacitor, inductor, filter or antenna.

16. A method for determining impedance characteristics of an antenna system comprising the steps of:
providing a first internally generated radio frequency (RF) signal to an antenna system;
measuring a reflected voltage from the antenna system using a voltage measuring network;
measuring a reflected current from the antenna system using a current measuring network;
providing a local oscillator signal;
down converting a reflected voltage measurement to a lower frequency using a first mixer;
down converting a reflected current measurement to a lower frequency using a second mixer;
receiving signals from the first mixer and second mixer using at least one digital microcontroller;
operating the first mixer and second mixer in a linear manner in the presence of a substantially high reflected voltage measurement or reflected current measurement received from the antenna system; and
calculating a complex impedance using the at least one digital microcontroller from a magnitude and phase angle of the high reflected voltage measurement or high reflected current measurement.

17. A method for determining impedance characteristics as in claim 16, further including the step of:
utilizing direct digital synthesis (DDS) in the first oscillator and second oscillator.

18. A method for determining impedance characteristics as in claim 16, further comprising the step of:
measuring a voltage drop across at least one resistor in the voltage measuring network.

19. A method for determining impedance characteristics as in claim 16, further comprising the step of:
providing an attenuated input signal to the first mixer at a predetermined level.

20. A method for determining impedance characteristics as in claim 16, further comprising the step of:
providing an attenuated input to the second mixer at a predetermined level.

21. A method for determining impedance characteristics as in claim 16, further comprising the step of:
utilizing at least one operational amplifier providing a serial output from the first mixer and second mixer to the at least one microcontroller.

22. A method for determining impedance characteristics as in claim 16 further comprising the step of:
amplifying the output of the first oscillator to a predetermined power level.

23. A method for determining impedance characteristics as in claim 16, further comprising the step of:
utilizing the at least one microcontroller for displaying vector impedance measurement data.

* * * * *